United States Patent [19]
Forbes

[11] Patent Number: 5,959,896
[45] Date of Patent: Sep. 28, 1999

[54] MULTI-STATE FLASH MEMORY CELL AND METHOD FOR PROGRAMMING SINGLE ELECTRON DIFFERENCES

[75] Inventor: Leonard Forbes, Corvallis, Oreg.

[73] Assignee: Micron Technology Inc., Boise, Id.

[21] Appl. No.: 09/031,930

[22] Filed: Feb. 27, 1998

Related U.S. Application Data

[63] Continuation of application No. 08/790,903, Jan. 29, 1997, Pat. No. 5,740,104.

[51] Int. Cl.$^6$ .................................................... G11C 13/00
[52] U.S. Cl. ............................... 365/185.33; 365/185.01; 365/185.1
[58] Field of Search ........................... 365/185.01, 185.1, 365/185.33, 189.01, 218

[56] References Cited

U.S. PATENT DOCUMENTS

| | | | |
|---|---|---|---|
| 4,507,673 | 3/1985 | Aoyama et al. | 357/23 R |
| 5,021,999 | 6/1991 | Kohda et al. | 365/168 |
| 5,027,171 | 6/1991 | Reedy et al. | 357/23.5 |
| 5,055,890 | 10/1991 | Dawson et al. | 365/218 |
| 5,111,430 | 5/1992 | Morie | 365/185 |
| 5,253,196 | 10/1993 | Shimabukuro | 365/45 |
| 5,293,560 | 3/1994 | Harari | 365/185 |
| 5,317,535 | 5/1994 | Talreja et al. | 365/185 |
| 5,357,134 | 10/1994 | Shimoji | 257/325 |
| 5,388,069 | 2/1995 | Kokubo | 365/185 |
| 5,418,743 | 5/1995 | Tomioka et al. | 365/189.01 |
| 5,424,993 | 6/1995 | Lee et al. | 365/218 |
| 5,430,670 | 7/1995 | Rosenthal | 365/45 |
| 5,434,815 | 7/1995 | Smarandoiu et al. | 365/189.01 |
| 5,438,544 | 8/1995 | Makino | 365/185 |
| 5,449,941 | 9/1995 | Yamazaki et al. | 257/411 |
| 5,467,306 | 11/1995 | Kaya et al. | 365/185.2 |
| 5,477,485 | 12/1995 | Bergemont et al. | 365/185.24 |
| 5,485,422 | 1/1996 | Bauer et al. | 365/168 |
| 5,493,140 | 2/1996 | Iguchi | 257/316 |
| 5,508,543 | 4/1996 | Hartstein et al. | 257/314 |
| 5,627,781 | 5/1997 | Hayashi et al. | 365/185.2 |
| 5,670,790 | 9/1997 | Katoh et al. | 257/14 |
| 5,714,766 | 2/1998 | Chen et al. | 257/20 |
| 5,754,477 | 5/1998 | Forbes . | |

FOREIGN PATENT DOCUMENTS

| | | | |
|---|---|---|---|
| 0139185 | 5/1985 | European Pat. Off. | G11C 17/00 |
| 0448118 | 9/1991 | European Pat. Off. | G11C 16/04 |
| 0750353 | 12/1996 | European Pat. Off. | H01L 29/86 |

OTHER PUBLICATIONS

Alok, D., et al., "Electrical Properties of Thermal Oxide Grown on N–type 6H–Silicon Carbide", *Applied Physics Letters*, 64, 2845–2846, (May 23, 1994).

Baldwin, G.L., et al., "The Electronic Conduction Mechanism of Hydrogenated Nanocrystalline Silicon Films", *Proc. 4th Int. Conf. on Solid–State and Int. Circuit Tech. Beijing*, 66–68, (1995).

Bauer, M., et al., "A Multilevel–Cell 32 Mb Flash Memory", *Digest IEEE*, Solid–State Circuits Conf.,, 440, (1995).

Boeringer, D.W., et al., "Avalanche amplification of multiple resonant tunneling through parallel silicon microcrystallites", *Physical Rev. B*, 51, 13337–13343, (1995).

(List continued on next page.)

*Primary Examiner*—Terrell W. Fears
*Attorney, Agent, or Firm*—Schwegman, Lundberg, Woessner & Kluth P.A.

[57] ABSTRACT

A flash memory cell. The cell includes a transistor with a floating gate that is formed from a number of crystals of semiconductor material. The crystals are disposed in the gate oxide of the transistor. The size of the crystals and their distance from a surface of a semiconductor layer of the transistor are chosen such that the crystals can trap a single electron by hot electron injection. Each trapped electron causes a measurable change in the drain current of the transistor. Thus, multiple data bits can be stored and retrieved by counting the changes in the drain current.

13 Claims, 2 Drawing Sheets

OTHER PUBLICATIONS

Demichelis, F., et al., "Influence of Doping on the Structural and Optoelectronic Properties of Amorphous and Microcrystalline Silicon Carbide", *Journal of Applied Physics,* 72, 1327–1333, (Aug. 15, 1992).

Demichelis, F., et al., "Physical Properties of Undoped and Doped Microcrystalline SiC:H Deposited By PECVD", *Materials Research Society Symposium Proceedings,* 219, Anaheim, CA, 413–418, (Apr. 30 –May 3, 1991).

Dipert, B., et al., "Flash Memory Goes Mainstream", *IEEE Spectrum,* 30, 48–52, (1993).

Edelberg, E., et al., "Visible Luminescence from Nanocrystalline silicon films produced by plasma enhanced chemical vapor deposition", *Appl. Phys. Lett.,* 68, 1415–1417, (1996).

Hamakawa, Y., et al., "Optoelectronics and Photovoltaic Applications of Microcrystalline SiC", *Materials Research Society Symposium Proceedings,* 164, Boston, MA, 291–301, (Nov. 29 –Dec. 1, 1989).

Hu, G., "Will Flash Memory Replace Hard Disk Drive?", *IEEE Electron Devices Meeting, Session 24,* (Dec. 13, 1994).

Hybertsen, M.S., "Absorption and Emission of Light in Nanoscale Silicon Structures", *Phys. Rev. Lett.,* 72, 1514–1517, (1994).

Jung, T.S., et al., "A 3.3V 128Mb Multi–Level NAND Flash Memory for Mass Storage Applications", *1996 IEEE Solid–State Circuits Conf.,* Digest of Technical Papers, 512, (1996).

Kamata, T., et al., "Substrate Current Due to Impact Ionization in MOS–FET", *Japan J. Appl. Phys.,* vol. 15, 1127–1134, (Jun. 1976).

Kato, M., et al., "Read–Disturb Degradation Mechanism due to Electron Trapping in the Tunnel Oxide for Low–voltage Flash Memories", *IEEE Electron Device Meeting,* 45–48, (1994).

Ohkawa, M., et al., "A 98 mm 3.3V 64Mb Flash Memory with FN–NOR type 4–Level Cell", *IEEE,* 512, (1996).

Prendergast, J., "FLASH or DRAM: Memory Choice for the Future", *IEEE Electron Device Meeting, Session 25,* Phoenix, AZ, (1995).

Schoenfeld, O., et al., "Formation of Si Quantum dots in Nanocrystalline silicon", *Proc. 7th Int. Conf. on Modulated Semiconductor Structures, Madrid,* 605–608, (1995).

Shimabukuro, R.L., et al., "Circuitry for Artificial Neural Networks with Non–volatile Analog Memories", *IEEE,* vol. 2, 1217–1220, (1989).

Shimabukuro, R.L., et al., "Dual–Polarity Nonvolatile MOS Analogue Memory (MAM) Cell for Neural–Type Circuitry", *IEEE,* vol. 24, 1231–1232, (Sep. 15, 1988).

Suh, K.D., et al., "A 3.3 V 32 Mb NAND Flash Memory with Incremental Step Pulse Programming Scheme", *IEEE,* vol. 30, 1149–1156, (Nov. 1995).

Sze, S.M., "Physics of Semiconductor Devices", *Wiley–Interscience 2d Ed.,* New York, 482, (1981).

Takeuchi, K., et al., "A Double–Level–V Select Gate Array Architecture for Multilevel NANAD Flash Memories", *IEEE Journal of Solid–State Circuits,* vol. 31, 602–609, (Apr. 1996).

Tiwari, S., et al., "A silicon nanocrystal based memory", *Appl. Physics Lett.,* 68, 1377–1379, (1996).

Tiware, S., et al., "Volatile and Non–Volatile Memories in Silicon with Nano–Crystal Storage", *Int'l Electron Devices Meeting: Technical Digest,* Washington, D.C., 521–524, (Dec. 1995).

Tsu, R., et al., "Slow Conductance oscillations in nanoscale silicon clusters of quantum dots", *Appl. Phys. Lett.,* 65, 842–844, (1994).

Tsu, R., et al., "Tunneling in Nanoscale Silicon Particles Embedded in an $SiO_2$ Matrix", *Abstract, IEEE Device Research Conference,* 178–179, (1996).

Ye, Q., et al., "Resonant Tunneling via Microcrystalline–silicon quantum confinement", *Physical Rev. B,* 44, 1806–1811, (1991).

Yih, C.M., et al., "A Consistent Gate and Substrate Current Model for Sub–Micron MOSFET's by Considering Energy Transport", *Int'l Symp. on VLSI Tech., Systems and Applic.,* Taiwan, 127–130, (1995).

Zhao, X., et al., "Nanocrystalline Si: a material constructed by Si quantum dots", *1st Int. Conf. on Low Dimensional Structures and Devices, Singapore,* 467–471, (1995).

MULTI-STATE FLASH MEMORY CELL AND METHOD FOR PROGRAMMING SINGLE ELECTRON DIFFERENCES

This application is a continuation of U.S. patent application Ser. No. 08/790,903, filed Jan. 29, 1997 now U.S. Pat. No. 5,740,104. The '903 application is incorporated herein by reference.

TECHNICAL FIELD OF THE INVENTION

The present invention relates generally to the field of electronic devices and, in particular, to a multi-state flash memory cell and method for programming single electron differences.

BACKGROUND OF THE INVENTION

Typically, computer systems store data on a magnetic medium such as a hard disk drive. The hard disk drive is an electromechanical component of the computer system that operates by storing polarities on magnetic material which can be rewritten quickly and as often as desired. A typical hard drive includes at least two moving parts that respond to control signals generated by a processor of the computer system. Conventionally, a hard disk drive includes a disk that is formed from an aluminum substrate that is rotatably mounted to a base. A magnetic material is deposited on a surface of the substrate. A rotatable actuator arm moves a ceramic transducer over the surface of the disk to read data from and write data to the hard disk. These mechanical parts are more delicate and less reliable than the other, solid state, components of the computer system. However, magnetic hard disk systems have dominated storage media for computers and related systems due to the low cost per bit of data and high density storage capacity of available magnetic hard disk systems when compared to conventional solid state alternatives.

Solid state memory devices store data in storage locations, referred to as "cells." Conventional designs only allow a single bit of data to be stored at a given time in each cell. Typically, a cell includes an access transistor and a storage element such as a capacitor or a floating gate that stores data based on the electric charge on the storage element. The electric charge in conventional applications represents either a binary "1" or "0" and thus conventional designs require a single transistor for each bit of data. The storage density for solid state memories is limited by the ability of designers to pack transistors on a semiconductor substrate. Although transistors can be packed more tightly together with each succeeding generation of design technology, this density does not compare well with the storage density of a magnetic medium.

Recently, designers have attempted to increase the storage density of flash memory cells by creating a memory cell that is capable of storing more than one data bit—so called "multi-state" flash memory cells. In a conventional flash memory, charge is stored on a floating gate of a field-effect transistor in response to a signal applied to a control gate. The charge on the floating gate represents either a binary "1" or "0" based on the effect the charge has on the current through the transistor. Initially, the floating gate is not charged, which represents a binary "1." When a binary "0" is stored, electrons are forced to the floating gate by a sufficient voltage on the control gate to induce hot electron injection which reduces the drain current of the transistor. Thus, by sensing the drain current of the transistor, the value of the data bit stored by the flash memory cell can be determined.

To increase the number of states that can be stored, designers have attempted to use adjustments to the threshold voltage of the transistor. Unfortunately, this technique has only been shown to work with, at most, storing two to four bits of data in a single cell due to variations in threshold voltage of each transistor in the array of memory cells. Otherwise, complex programming techniques to adjust the threshold voltage of the transistors during each read and write operation must be used.

In S. Tiwari et al, *Volatile and Non-Volatile Memories in Silicon with Nano-Crystal Storage*, IEEE Int. Electron Device Meeting, pp. 521–524 (1995) (hereinafter "Tiwari"), researchers from IBM describe an alternative structure for a flash memory device. The proposed memory device includes a floating gate that is formed within 15 to 25 Å of a surface of the semiconductor substrate. The floating gate is formed from so called "nano-crystals" that trap electrons by a tunneling effect This structure is not practical due to difficulties in fabricating a gate oxide with a thickness on the order of 4 to 5 atoms. It also does not address the problem of storing multiple data bits in a single memory cell.

For the reasons stated above, and for other reasons stated below which will become apparent to those skilled in the art upon reading and understanding the present specification, there is a need in the art for a solid state memory device that is capable of storing multiple bits in each memory cell.

SUMMARY OF THE INVENTION

The above-mentioned problems with memory devices and other problems are addressed by the present invention and will be understood by reading and studying the following specification. A memory device and method are described which allow storing a value that represents a number of bits in a single cell.

In particular, an illustrative embodiment of the present invention includes a transistor with a floating gate that stores a value that represents a number of bits of data. The value is created by trapping electrons on the floating gate during a write operation. The floating gate comprises a number of conductive elements implanted at a position in a gate oxide of the transistor so as to trap electrons by hot electron injection. The transistor also includes a control gate that is coupled to a word line and a drain region coupled to a data line.

In another embodiment, the present invention provides a method of storing a value that represents a number of bits in a single cell of a memory device. The method includes trapping electrons on a floating gate of a cell. The electrons induce step changes in the drain current of the transistor due to the structure of the floating gate. The floating gate comprises, for example, a number of nano-crystals of semiconductor material. The method also monitors the step changes in the drain current of a transistor in the memory cell. The steps of trapping electrons and monitoring the step changes are repeated until the drain current has changed by an amount that is associated with the value of the data to be stored on the floating gate of the memory cell.

DETAILED DESCRIPTION OF THE INVENTION

In the following detailed description of the preferred embodiments, reference is made to the accompanying drawings which form a part hereof, and in which are shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

For purposes of this specification, prepositions, such as "on," "side," (as in "sidewall"), "higher," "lower," "over," and "under" are defined with respect to the conventional planar working surface being on the top surface of the chip or wafer, regardless of the orientation the chip is actually held.

Figure 1:
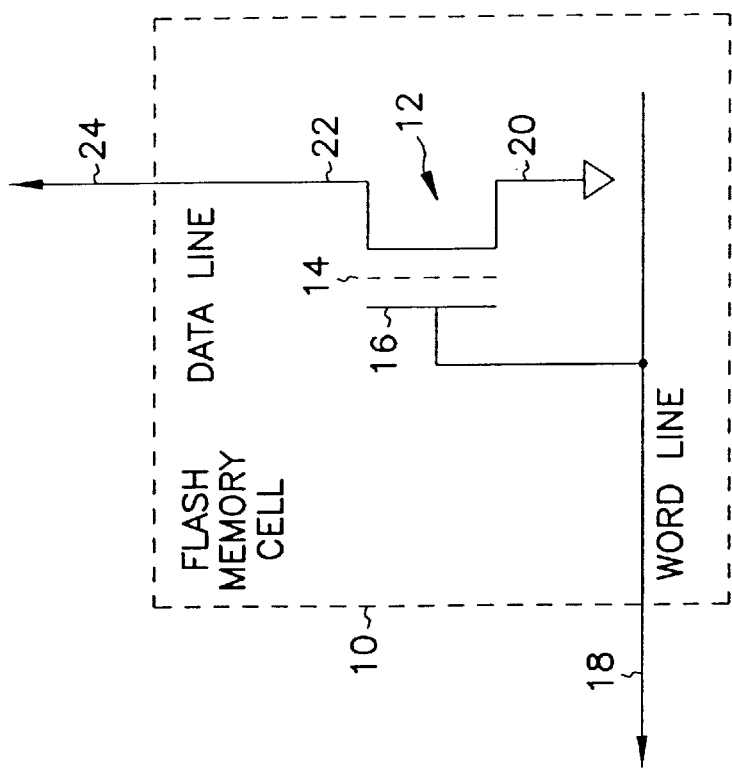
FIG. 1 is a schematic diagram that illustrates an embodiment of a flash memory cell according to the teachings of the present invention.

FIG. 1 is a schematic diagram of an illustrative embodiment of a flash memory cell. indicated generally at 10, that is constructed according to the teachings of the present invention. Memory cell 10 includes field-effect transistor 12 with floating gate 14 and control gate 16. The term "floating gate" signifies that gate 14 is electrically isolated in an insulative material, such as a gate oxide. Floating gate 14 is constructed of a number of crystals of conductive material as described below with respect to FIG. 2. Transistor 12 also includes source 20 and drain 22. Source 20 is coupled to ground potential and drain 24 is coupled to data line 24. Control gate 16 is coupled to word line 18.

Figure 2:
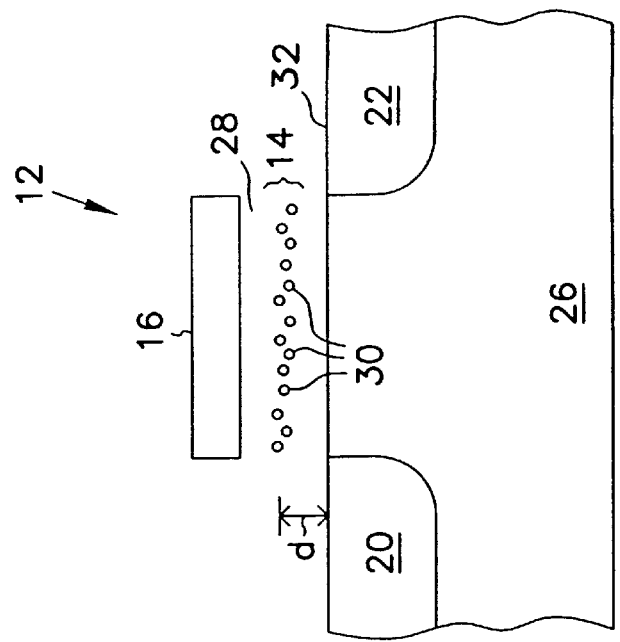
FIG. 2 is a cross sectional view of a transistor with a floating gate comprised of a number of gate elements for use in the flash memory cell of FIG. 1.

FIG. 2 is a cross sectional diagram of transistor 12 of memory cell 10. Floating gate 14 comprises crystals of, for example, silicon, silicon carbide, or other appropriate semiconductor material that are implanted in oxide layer 28 at low density using conventional processing techniques. Due to the low density of implantation, the semiconductor material nucleates into grains to form crystals 30. Crystals 30 are referred to as "nano-grains" or "nano-crystals" due to their typical size with a surface area on the order of $10^{-13}$ cm$^2$.

Crystals 30 of floating gate 14 are formed at a distance, d, of approximately 60 to 100 Å from surface 32 of semiconductor layer 26. Advantageously, formation of crystals 30 at this distance from surface 32 of semiconductor layer 26 is more easily realizable on a commercial production scale than the crystals described in Tiwari. Further, this distance, coupled with the size of crystals 30, advantageously allows each crystal 30 to trap at most one electron which causes a step change in the drain current of transistor 12. Alternatively, the crystals could be sized to trap another acceptable number of electrons. The step change in drain current is measurable and thus allows storage of a value that represents multiple data bits with a single transistor 12.

The step change in current of transistor 12 can be seen from the following analysis. First, the capacitance between crystal 30 and semiconductor layer 26 is given according to the following equation:

$$C = \frac{\epsilon_r \epsilon_o \times \text{Area}}{d} + \text{correction for fringing}$$

in which C is the capacitance, Area is the surface area of crystal 30, d is the distance between crystal 30 and surface 32 of semiconductor layer 26, and the correction term accounts for the fact that crystal 30 has a smaller surface area than semiconductor layer 26 and the electric field will vary at the perimeter of crystals 30. Assuming that d is 100 angstroms and the area of crystal 30 is on the order of $10^{-13}$ cm$^2$, the capacitance of crystal 30 is approximately $1.0 \times 10^{-19}$ Farad. The charge of an electron is $1.6 \times 10^{-19}$ coulombs and will result in a change of potential of crystal 30 by approximately 1.6 volts. Crystal 30 becomes repulsive to electrons once a single electron is trapped during a write operation. Thus, each crystal 30 is constrained to a distinct change in charge state by capturing only one electron. The change in charge state in turn causes a distinct step change in drain current of transistor 12. Transistor 12 amplifies the change in drain current and thus the change is easily detectable.

Floating gate 14 of memory cell 10 can be programmed to store the value that represents a number of bits at the same time. To do this, the number of step changes in drain current during a write operation are counted. The number of step changes in drain current relates to the value of the bits to be stored. In this manner, a multiplicity of different states can be stored resulting in the storage of multiple bits on a single floating gate 14. For example, to store the binary number 1001, nine step changes in drain current are induced by trapping electrons on floating gate 14.

In operation, flash memory cell 10 is programmed with a value that represents a number of bits of data on floating gate 14. The value can be written to and read from floating gate 14. The value can also be erased from floating gate 14. To program or write to floating gate 14, the voltage on word line 18 is raised to a sufficient level, e.g., 12 volts, and a potential of, e.g., 5 volts is applied to drain 22 so as to cause electrons to be trapped on floating gate 14 by hot electron injection. According to this embodiment, tunneling of electrons to floating gate 14 is not used during the write operation due to the distance of floating gate 14 from semiconductor layer 26 in transistor 12.

Crystals 30 of floating gate 14 are sized so that each crystal ideally can trap only a single electron. As electrons are trapped by floating gate 14, crystals 30 induce a step change in the drain current of transistor 12. This step current is monitored on data line 24 until a selected number of step changes have occurred that relate to the value of the data to be stored on the floating gate. At this point, the voltage on word line 18 is reduced so that the selected data is stored on floating gate 14.

To read the data on floating gate 14, word line 18 is raised to a sufficient voltage to cause transistor 12 to conduct current. The current is sensed on data line 24 and compared to the current of transistor 12 for a time prior to programming floating gate 14. From this comparison, the number of step changes in drain current induced during programming can be determined. This result provides the value of the data representing a number of bits stored on floating gate 14.

To erase the charge stored on floating gate 14, source 20 is grounded and word line 18 is driven to minus 12 volts. Thus, electrons are discharged from floating gate 14 to source 20 by tunneling.

Figure 3:
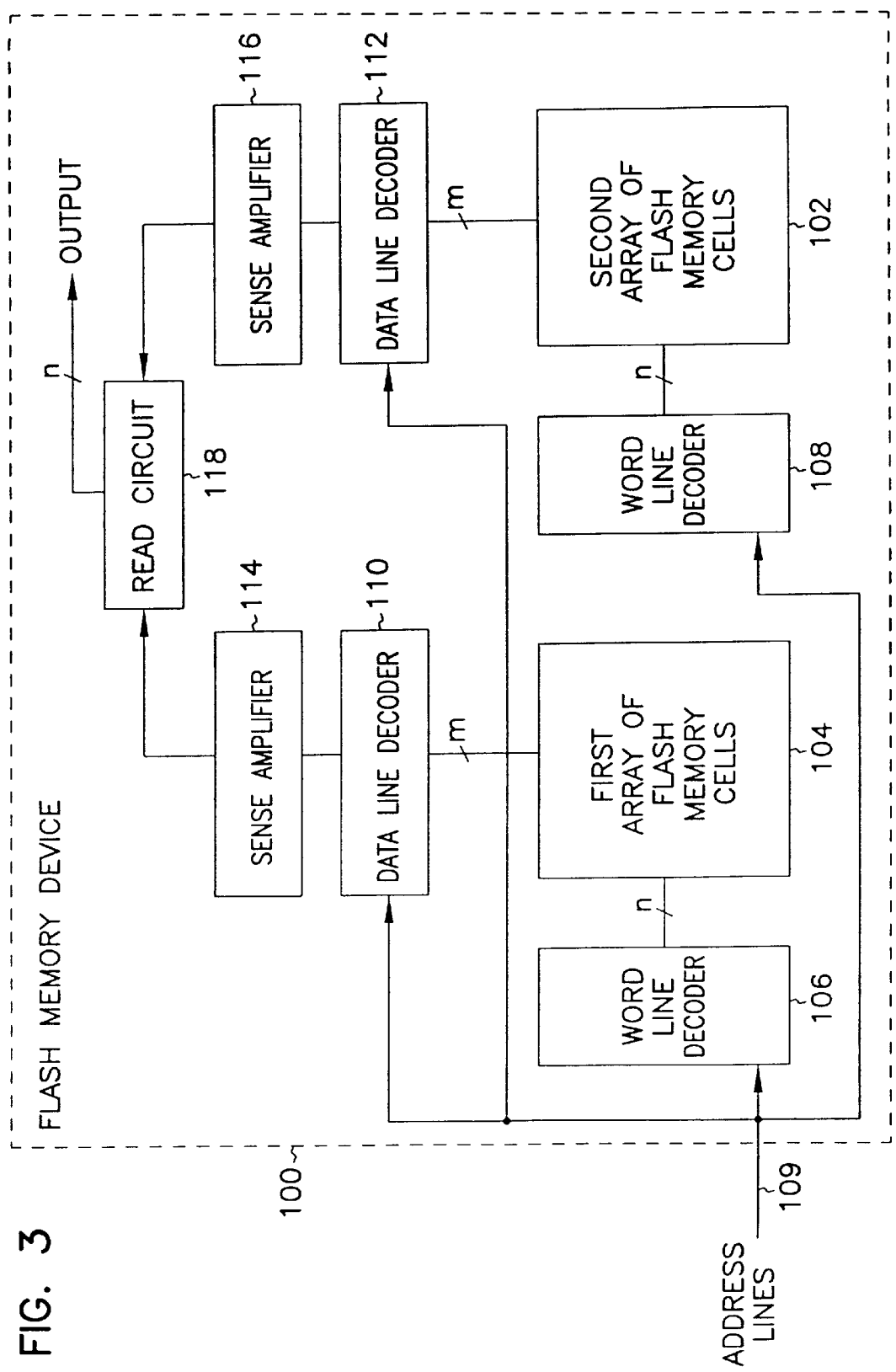
FIG. 3 is a block diagram of a flash memory device according to the teachings of the present invention.

FIG. 3 is a block diagram of an embodiment of a memory device, indicated generally at 100, that is constructed according to the teachings of the present invention. Memory device 100 includes first and second arrays 102 and 104 of flash memory cells. First array 102 stores data using a number of memory cells of the type shown and described above with respect to FIGS. 1 and 2. Second array 104 stores the state of the cells in first array 102 at a time prior to storing data in first array 102. Thus, second array 104 provides a comparison basis during a read operation for determining the number of step changes in drain current induced during the programming of a memory cell during a write operation.

Each cell of first array 102 is associated with a cell of second array 104. The associated cells may be accessed according to address signals provided by an external system (not shown). Address lines 109 are coupled to first and second word line decoders 106 and 108, and first and second data line decoders 110 and 112. First word line decoder 106 and first data line decoder 110 are coupled to first array 104. Similarly, second word line decoder 108 and second data line decoder 112 are coupled to second array 102. First and second sense amplifiers 114 and 116 are coupled to first and second data line decoders 110 and 112, respectively. Read circuit 118 is coupled to first and second sense amplifiers 114 and 116. Read circuit 118 provides the output of flash memory device 100.

In operation, flash memory device 100 writes, reads and erases multiple bits in each storage location of first array 104.

In write mode, flash memory device 100 receives an address on address line 109. Word line decoders 106 and 108 decode the associated word line for a selected cell and activate the word line. Data line decoders 110 and 112 similarly decode the data line for the desired cell. The current state of the selected cell in first array 104 is stored in the associated cell in array 102. The selected cell in array 104 is then programmed to a selected state to store a value that represents a number of bits in the cell.

In read mode, the address of the selected cell is similarly decoded and the associated cells of arrays 104 and 102 are accessed. Data line decoders 110 and 112 couple the selected cell to sense amplifiers 114 and 116, respectively. Read circuit 118 compares the stored value of the cell from array 104 with the initial state stored in array 102. The comparison results in an output signal that represents the value of a number of bits.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the data line decoders are not necessary when a sense amplifier is provided for each data line. Further, crystals 30 can be formed from other materials that are capable of trapping an electron by hot electron injection. The placement and size of crystals 30 can also be varied so long as the crystals still cause a distinct, measurable change in current in transistor 12.

What is claimed is:

1. A flash memory cell, comprising:
   a transistor with a control gate coupled to a word line, a drain region coupled to a data line, and a floating gate that stores a value that represents a number of bits of data; and
   wherein the floating gate comprises a number of conductive elements implanted at a position in a gate oxide of the transistor, wherein the size and location of the conductive elements are selected such that each conductive element traps at most one electron by hot electron injection.

2. The flash memory cell of claim 1, wherein the floating gate is disposed at a distance of approximately 60 to 100 angstroms from a surface of a semiconductor layer of the transistor.

3. A transistor, comprising:
   a layer of semiconductor material;
   first and second source/drain regions implanted in the semiconductor material;
   a gate oxide disposed outwardly from the layer of semiconductor material;
   a control gate disposed outwardly from the gate oxide; and
   a floating gate including a number of conductive elements that are implanted in the gate oxide at a distance from a surface of the semiconductor material, wherein the conductive elements have a size and are disposed at a distance from the surface of the layer of semiconductor material such that the conductive elements each trap at most one electron by hot electron injection.

4. The transistor of claim 3, wherein the conductive elements comprise crystals of semiconductor material implanted in the gate oxide.

5. The transistor of claim 4, wherein the crystals are disposed at a distance of 60 to 100 angstroms from the surface of the layer of semiconductor material.

6. A memory device, comprising:
   a first array of flash memory cells with implanted floating gates;
   a second array of flash memory cells with implanted floating gates, each cell storing the state of an associated cell of the first array for a time prior to storing data in the associated cell of the first array;
   a word line decoder and a data line decoder coupled to the first and second arrays for accessing associated cells of the first and second arrays; and
   a read circuit coupled to the first and second arrays that compares the values of associated cells of the first and second arrays to produce an output signal.

7. The memory device of claim 6, wherein the implanted floating gates each comprise a number of crystals disposed in a gate oxide so as to trap electrons by hot electron injection.

8. A memory device comprising:
   a first array of flash memory cells with implanted floating gates a second array of flash memory cells with implanted floating gates, each cell storing the state of an associated cell of the first array for a time prior to storing data in the associated cell of the first array;
   a word line decoder and a data line decoder coupled to the first and second arrays for accessing associated cells of the first and second arrays;
   a read circuit coupled to the first and second arrays that compares the values of associated cells of the first and second arrays to produce an output signal; and
   wherein each memory cell includes a field-effect transistor formed on a semiconductor layer, and each floating gate comprises nano-crystals that are disposed at a distance of 60 to 100 angstroms from the semiconductor layer.

9. The memory device of claim 8, wherein the size of the nano-crystals is chosen such that a single electron trapped by the nano-crystal changes the voltage of the nano-crystal sufficiently so that the nano-crystal repels other electrons that approach the nano-crystal during a write operation.

10. A memory device, comprising:
a first array of flash memory cells with implanted floating gates;
a second array of flash memory cells with implanted floating gates, each cell storing the state of an associated cell of the first array for a time prior to storing data in the associated cell of the first array;
a word line decoder and a data line decoder coupled to the first and second arrays for accessing associated cells of the first and second arrays;
a read circuit coupled to the first and second arrays that compares the values of associated cells of the first and second arrays to produce an output signal;
wherein the implanted floating gates each comprise a number of crystals disposed in a gate oxide so as to trap electrons by hot electron injection and
wherein the crystals comprise a semiconductor material.

11. A method of storing data in a flash memory device having an array of memory cells addressable by word and data lines, comprising:
applying a voltage to a control gate of a selected memory cell;
trapping electrons on conductive elements implanted in a gate oxide of the selected memory cell by hot electron injection;
monitoring step changes in current of the selected memory cell; and
changing the voltage on the control gate when the current has changed by a number of steps corresponding to a desired value to be stored in the memory cell.

12. The method of claim 11, and further comprising applying a voltage to a drain of the selected memory cell.

13. A method of storing data in a memory device, the method comprising:
trapping an electron on a floating gate of a memory cell, the floating gate comprising a number implanted, conductive elements;
monitoring step changes in the drain current of a transistor in the memory cell; and
repeating the trapping and monitoring steps until the drain current has changed by an amount that is associated with the value of the data to be stored on the floating gate of the memory cell.

* * * * *

UNITED STATES PATENT AND TRADEMARK OFFICE
CERTIFICATE OF CORRECTION

PATENT NO.:5,959,896

DATED:Sep. 28, 1999

INVENTOR(S) :Forbes

It is certified that error appears in the above-identified patent and that said Letters Patent is hereby corrected as shown below:

In column 6, line 51, insert a semi-colon after "gates", therfor.

Signed and Sealed this

Thirteenth Day of June, 2000

*Attest:*

Q. TODD DICKINSON

*Attesting Officer*      *Director of Patents and Trademarks*